(12) United States Patent
Laven et al.

(10) Patent No.: US 9,935,126 B2
(45) Date of Patent: Apr. 3, 2018

(54) METHOD OF FORMING A SEMICONDUCTOR SUBSTRATE WITH BURIED CAVITIES AND DIELECTRIC SUPPORT STRUCTURES

(71) Applicant: Infineon Technologies AG, Neubiberg (DE)

(72) Inventors: Johannes Georg Laven, Taufkirchen (DE); Matteo Dainese, Villach (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/479,518

(22) Filed: Sep. 8, 2014

(65) Prior Publication Data

US 2016/0071759 A1 Mar. 10, 2016

(51) Int. Cl.
*H01L 21/762* (2006.01)
*H01L 27/12* (2006.01)
(Continued)

(52) U.S. Cl.
CPC ...... *H01L 27/1203* (2013.01); *H01L 21/0265* (2013.01); *H01L 21/02233* (2013.01);
(Continued)

(58) Field of Classification Search
CPC .......... H01L 21/76248; H01L 29/0649; H01L 21/31111; H01L 21/76232; H01L 21/324;
(Continued)

(56) References Cited

U.S. PATENT DOCUMENTS 4,551,743 A 11/1985 Murakami
4,845,048 A 7/1989 Tamaki et al.
(Continued)

FOREIGN PATENT DOCUMENTS

DE 10123818 B4 9/2006
JP 2012028494 A * 2/2012
(Continued)

OTHER PUBLICATIONS

Sato et al., (2004), Fabrication of Silicon-on-Nothing Structure by Substrate 100 Engineering Using the Empty-Space-in-Silicon Formation Technique, Japanese Journal of Applied Physics, 43(1), 12-18).*

(Continued)

*Primary Examiner* — Phat X Cao
*Assistant Examiner* — Mohammad M Hoque
(74) *Attorney, Agent, or Firm* — Murphy, Bilak & Homiller, PLLC

(57) ABSTRACT

A method of forming a semiconductor device includes forming a plurality of trenches extending into a semiconductor substrate from a first surface of the semiconductor substrate. Each of the trenches includes a narrower part in open communication with a wider part that is spaced apart from the first surface by the narrower part. The narrower part of adjacent trenches is laterally separated by a first region of the semiconductor substrate. The wider part of adjacent trenches is laterally separated by a second region of the semiconductor substrate that is narrower than the first region. The method further includes introducing an oxidizing agent into the wider part of the trenches through the narrower part of the trenches to oxidize the second region of the semiconductor substrate between adjacent trenches to form dielectric support structures that support the first region of the semiconductor.

15 Claims, 15 Drawing Sheets

(51) Int. Cl.

| | |
|---|---|
| *H01L 21/02* | (2006.01) |
| *H01L 21/311* | (2006.01) |
| *H01L 21/324* | (2006.01) |
| *H01L 21/768* | (2006.01) |
| *H01L 49/02* | (2006.01) |
| *H01L 29/06* | (2006.01) |
| *H01L 21/74* | (2006.01) |
| *H01L 23/367* | (2006.01) |
| *H01L 23/528* | (2006.01) |
| *H01L 23/00* | (2006.01) |
| H01L 27/092 | (2006.01) |

(52) U.S. Cl.
CPC .. *H01L 21/02647* (2013.01); *H01L 21/02667* (2013.01); *H01L 21/31111* (2013.01); *H01L 21/324* (2013.01); *H01L 21/3247* (2013.01); *H01L 21/743* (2013.01); *H01L 21/76232* (2013.01); *H01L 21/76248* (2013.01); *H01L 21/76877* (2013.01); *H01L 23/3677* (2013.01); *H01L 23/5286* (2013.01); *H01L 23/562* (2013.01); *H01L 28/40* (2013.01); *H01L 29/0649* (2013.01); *H01L 21/31144* (2013.01); *H01L 27/0922* (2013.01)

(58) Field of Classification Search
CPC ......... H01L 21/02647; H01L 21/02233; H01L 28/40; H01L 21/31144; H01L 21/76877
USPC ....................................................... 438/427
See application file for complete search history.

(56) References Cited

U.S. PATENT DOCUMENTS

| | | | |
|---|---|---|---|
| 6,285,057 B1 * | 9/2001 | Hopper | H01L 21/76264 257/330 |
| 6,448,115 B1 | 9/2002 | Bae | |
| 6,521,538 B2 | 2/2003 | Soga et al. | |
| 6,551,944 B1 | 4/2003 | Fallica et al. | |
| 6,566,691 B1 | 5/2003 | Inoue et al. | |
| 7,423,316 B2 | 9/2008 | Kawaji et al. | |
| 7,445,973 B2 | 11/2008 | Gonzalez et al. | |
| 7,800,187 B2 | 9/2010 | Matsuura | |
| 7,906,388 B2 | 3/2011 | Sonsky | |
| 8,022,470 B2 | 9/2011 | Hirler | |
| 8,222,681 B2 | 7/2012 | Schulze et al. | |
| 9,653,477 B2 | 5/2017 | Cheng et al. | |
| 2002/0160581 A1 * | 10/2002 | Watanabe | H01L 21/823481 438/430 |
| 2004/0110383 A1 * | 6/2004 | Tanaka | H01L 21/76232 438/700 |
| 2004/0217434 A1 | 11/2004 | Lee et al. | |
| 2007/0040213 A1 | 2/2007 | Hotta et al. | |
| 2007/0190743 A1 * | 8/2007 | Colombo | H01L 21/76281 438/424 |
| 2008/0142923 A1 | 6/2008 | Tischler | |
| 2008/0265323 A1 | 10/2008 | Miyairi | |
| 2012/0018806 A1 | 1/2012 | Furukawa et al. | |
| 2012/0056241 A1 * | 3/2012 | Sumitomo | H01L 29/0619 257/139 |
| 2012/0261760 A1 | 10/2012 | Haneda et al. | |
| 2013/0056822 A1 | 3/2013 | Senoo | |
| 2013/0069151 A1 | 3/2013 | Ohta et al. | |
| 2013/0181322 A1 | 7/2013 | Hurwitz et al. | |
| 2015/0048413 A1 | 2/2015 | Arakawa et al. | |
| 2015/0380535 A1 | 12/2015 | Oshino et al. | |
| 2016/0293695 A1 | 10/2016 | Xu et al. | |

FOREIGN PATENT DOCUMENTS

| | | |
|---|---|---|
| JP | 2012204602 A | 10/2012 |
| KR | 1020020001016 A | 1/2002 |
| KR | 120120062991 A | 6/2012 |

OTHER PUBLICATIONS

Baburske, Roman et al., "Semiconductor Device and Reverse Conducting Insulated Gate Bipolar Transistor With Isolated Source Zones", U.S. Appl. No. 14/275,193, filed May 12, 2014.
Celler, G. K. et al., "Seeded oscillatory growth of Si over SiO2 by cw laser irradiation", Applied Physics Letters, Jun. 15, 1982, 1043-1045.
Laven, Johannes G. et al., "Semiconductor Device with Cell Trench Structures and Method of Manufacturing a Semiconductor Device", U.S. Appl. No. 13/963,312, filed Aug. 9, 2013.
Sumitomo, Masakiyo et al., "Low loss IGBT with Partially Narrow Mesa Structure (PNM-IGBT)", Proceedings of the 2012 24th International Symposium on Power Semiconductor Devices and ICs, Jun. 7, 2012, 17-20.

* cited by examiner

METHOD OF FORMING A SEMICONDUCTOR SUBSTRATE WITH BURIED CAVITIES AND DIELECTRIC SUPPORT STRUCTURES

TECHNICAL FIELD

The present invention generally relates to semiconductor device fabrication and more particularly relates to semiconductor substrates having buried cavities and dielectric structures.

BACKGROUND

Integrated circuits (ICs) typically include one or more devices (e.g., transistors, diodes, capacitors, etc.) formed in a semiconductor substrate. In Silicon on insulator (SOI) technology, the semiconductor substrate includes a buried layer of insulation. SOI substrates are preferable in some applications because the buried layer of insulation electrically isolates the devices, which leads to improved device characteristics. For example, benefits of SOI technology include lower parasitic capacitance, reduced cross-talk between neighboring devices, and decreased likelihood of a latchup condition during operation of the devices.

Known techniques for forming SOI substrates include SIMOX (Separation by Implantation of Oxygen) techniques and SmartCut techniques. In either process, a surface of a semiconductor substrate is oxidized to form a dielectric layer that will ultimately serve as the buried layer of insulation. Subsequently, porous layers are formed within the substrate. In the case of SmartCut, the porous layer is a layer of implanted hydrogen and wafer bonding is applied and the substrate is separated along the implanted hydrogen. In the case of SIMOX, the porous layer is a layer of implanted oxygen. Thus, the ion implantation and wafer bonding steps associated with these processes introduce expense and complexity in the substrate manufacturing process.

One alternative technique for forming an SOI substrate that does not involve ion implantation and wafer bonding is referred to as a Silicon on nothing (SON) technique. In SON technology, rather than using an oxide material (e.g., $SiO_2$) as the buried insulator layer, unfilled voids are provided in the substrate. These unfilled voids can be used to provide a buried insulator with favorable dielectric properties because the air within the voids has a lower dielectric constant than oxide materials. However, SON techniques are limited because increasing the size of the unfilled void comes at the expense of mechanical stability of the substrate. For example, if a void occupies a substantial portion of the chip area, only the lateral edges of the substrate support the upper portion of the substrate. As a result, the mechanical stability of the substrate is compromised.

SUMMARY

According to an embodiment, a method of forming a semiconductor device is disclosed. The method includes forming a plurality of trenches extending into a semiconductor substrate from a first surface of the semiconductor substrate. Each of the trenches includes a narrower part in open communication with a wider part that is spaced apart from the first surface by the narrower part. The narrower part of adjacent trenches is laterally separated by a first region of the semiconductor substrate. The wider part of adjacent trenches is laterally separated by a second region of the semiconductor substrate that is narrower than the first region. The method further includes introducing an oxidizing agent into the wider part of the trenches through the narrower part of the trenches to oxidize the second region of the semiconductor substrate between adjacent trenches to form dielectric support structures that support the first region of the semiconductor.

According to another embodiment, a method of forming a silicon-on-insulator substrate for forming one or more semiconductor devices thereon is disclosed. The method includes forming a plurality of trenches extending from a first surface of a semiconductor substrate. Each of the trenches includes a narrower part extending from the first surface to a wider cavity part that is spaced apart from the first surface. The method further includes oxidizing interior sidewalls of the trenches to form dielectric support structures. The dielectric support structures are arranged between the cavity parts of adjacent trenches and spaced apart from the first surface. The method further includes closing the narrower part of each of the trenches in the plurality to form a buried insulator layer beneath the first surface. The buried insulator layer includes the wider cavity portions of the trenches and the dielectric support structures.

According to another embodiment, a semiconductor device is disclosed. The semiconductor device includes a semiconductor substrate with a first surface. The device further includes one or more semiconductor devices formed on the first surface in an active area. The device further includes a plurality of cavities in the semiconductor substrate beneath the first surface. The device further includes dielectric support structures between each of the cavities and spaced apart from the first surface. The dielectric support structures support a part of the semiconductor substrate between the active area and the cavities. The dielectric support structures include an oxide.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A and 2B depicts oxidation of the trenches to form dielectric support structures between wider cavity parts of the trenches, according to an embodiment.

FIGS. 9A-9C depicts preventing the narrow part one of the trenches from completely converging during closing of the trenches by locally widening the narrow part of the trench, according to an embodiment.

DETAILED DESCRIPTION

Figure 1:
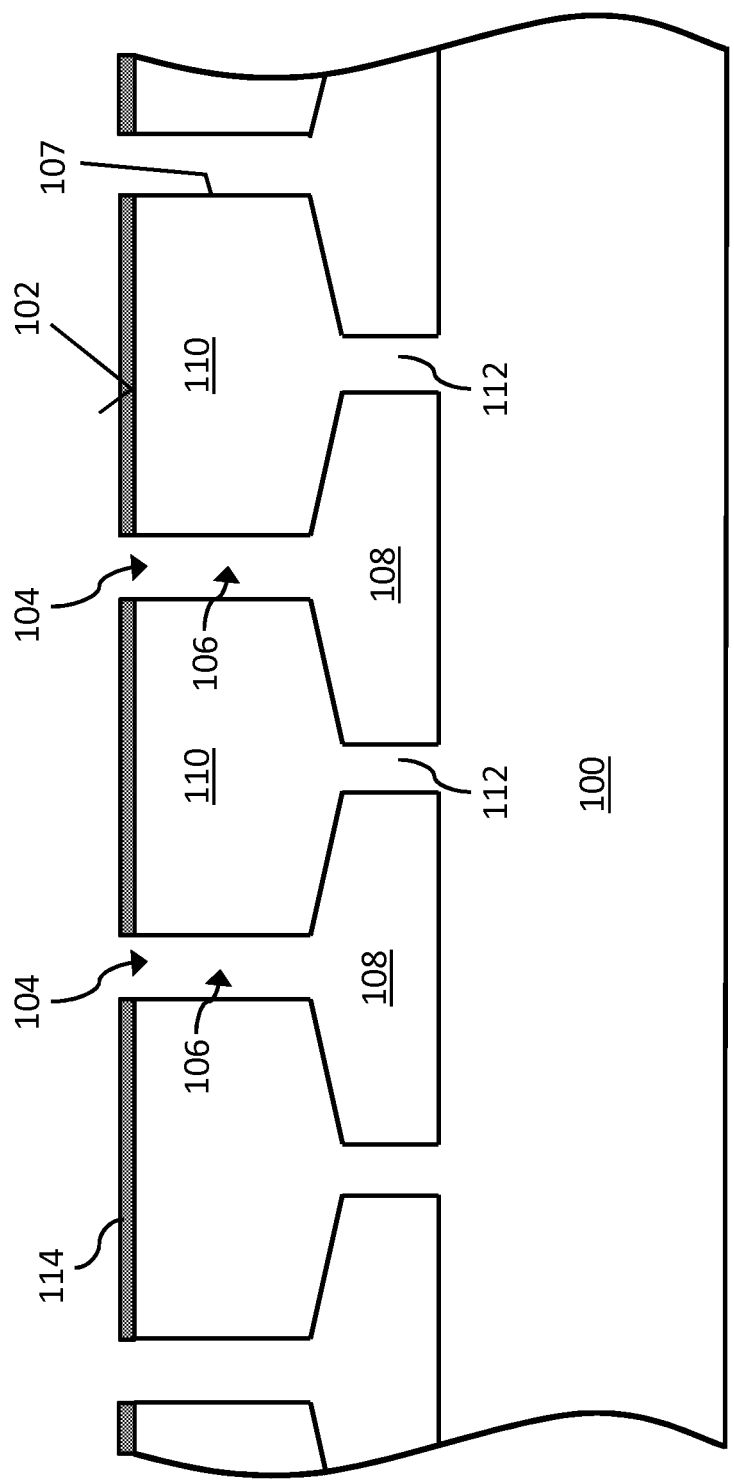
FIG. 1 depicts a partial cross-sectional view of a semiconductor substrate with a plurality of trenches formed in the substrate, according to an embodiment.

According to embodiments described herein, a semiconductor substrate is formed so that the substrate includes a plurality of buried cavities and dielectric support structures between the cavities. This may be realized by forming a plurality of bottleneck shaped trenches at a first surface of a semiconductor substrate. Each of these bottleneck shaped trenches includes a narrower part extending from the first surface to a wider part that is beneath the first surface. The trenches are laterally spaced apart from one another such that there is a relatively narrow region of semiconductor material between the wider parts of adjacent trenches. This narrow region of the semiconductor material is oxidized into a dielectric support structure by introducing an oxidizing agent into the narrower part of the trenches. Subsequently, the trenches may be closed off such that the wider part (or sections of the wider part) of some or all of the trenches is covered by semiconductor material. According to one embodiment, the trenches are closed by performing a hydrogen annealing process that causes the narrower part of the trench to collapse. According to an alternate embodiment, the trench is closed by an epitaxial lateral overgrowth process that forms an epitaxial layer at the surface of the semiconductor material extending over the narrower part of the trenches such that the wider part (or sections of the wider part) of some or all of the trenches is covered by semiconductor material.

The methods described herein allow for the production of multiple cavities (either filled or unfilled) within a semiconductor substrate without compromising the mechanical stability of the substrate. This improved mechanical stability is at least partly attributable to the dielectric support structures, which are disposed at regular intervals between the cavities. Furthermore, these dielectric support structures survive the above described hydrogen annealing process, which collapses the narrow portions of the trenches. Therefore, a continuous active device region may be formed above the cavities along the entire substrate or a substantial portion of the substrate. Further, this substrate is mechanically stable and does not exclusively rely on the semiconductor material at the lateral edge sides of the cavities for physical support of upper portion of the semiconductor material.

The cavities may be used to form a wide variety of substrate structures. For example, the above described process can be utilized to produce an SOI substrate in which the insulator layer includes a plurality of unfilled cavities and dielectric support structures between the cavities. This buried insulator layer has favorable isolative properties as the air within the cavities provides a low-k dielectric. Alternatively, the cavities may be filled with an electrical conductor or an electrical insulator. Further, the cavities may be accessible from the surface if one or more of the trenches (either in a section or in the entire trench) are not closed. Further, process steps may be taken some that some of the trenches are closed whereas other trenches are not closed. The buried cavities may be used to provide a buried bus line that is electrically connected to one or more electrical devices (e.g., MOSFETS, IGBTs, etc.). Alternatively or in addition, the trenches may be formed such that the narrow portion of one trench encloses and electrically isolates a portion of semiconductor material.

Referring to FIG. 1, a semiconductor substrate 100 having a first surface 102 is depicted. The semiconductor substrate 100 may be formed from any commonly known semiconductor material, such as silicon (Si), silicon carbide (SiC), germanium (Ge), a silicon germanium crystal (SiGe), gallium nitride (GaN), gallium arsenide (GaAs), and the like.

A plurality of trenches 104 is formed in the substrate 100 at the first surface 102. Each of the trenches 104 includes a narrower part 106 and a wider cavity part 108. The narrower part 106 and the wider cavity part 108 may collectively provide a bottleneck shape. The narrower part 106 is in open communication with a wider cavity part 108. That is, the narrower part 106 extends from the first surface 102 to the wider cavity part 108 such that the wider cavity part 108 is accessible from the first surface 102 via the narrower part 106.

The narrower parts 106 of adjacent trenches 104 are laterally separated by a first region 110 of the semiconductor substrate 100 and the wider cavity part 108 of adjacent trenches 104 are laterally separated by a second region 112 of the semiconductor substrate 100 that is narrower than the first region 100. Thus, the semiconductor material between adjacent ones of the trenches 104 has an inverse geometry as the trenches 104.

The trenches 104 may be formed using known techniques, such as a masked etching. According to an embodiment, the trenches 104 are formed by providing an etch-resistant mask 114 at the first surface 102 and subsequently performing a dry or wet chemical etching process. The mask includes openings that define the locations of the trenches 104. In another embodiment, the narrower parts 106 of the trenches 104 may be formed by an initial anisotropic etching step in which semiconductor material is removed only in a vertical direction (i.e., perpendicular to the first surface 102) and at the same time a passivating protection film 107 is deposited on the sidewalls 106. The passivating film 107 may comprise complex fluorocarbon polymers or a halogenated silica-based material. Subsequently, the process parameters are dynamically changed, in a controlled ramp fashion, in order to shift the balance of the process to a more isotropic etching effect, in which semiconductor material is removed in both the vertical direction and the lateral direction (i.e., parallel to the first surface 102) to form the wider cavity parts 108. Meanwhile, the narrower part 106 remains protected by the passivating film 107. The process can be monitored in real time e.g. by ellipsometric/scatterometric methods to ensure reproducible control of the dimension of the second (separation) region 112.

Figure 2:
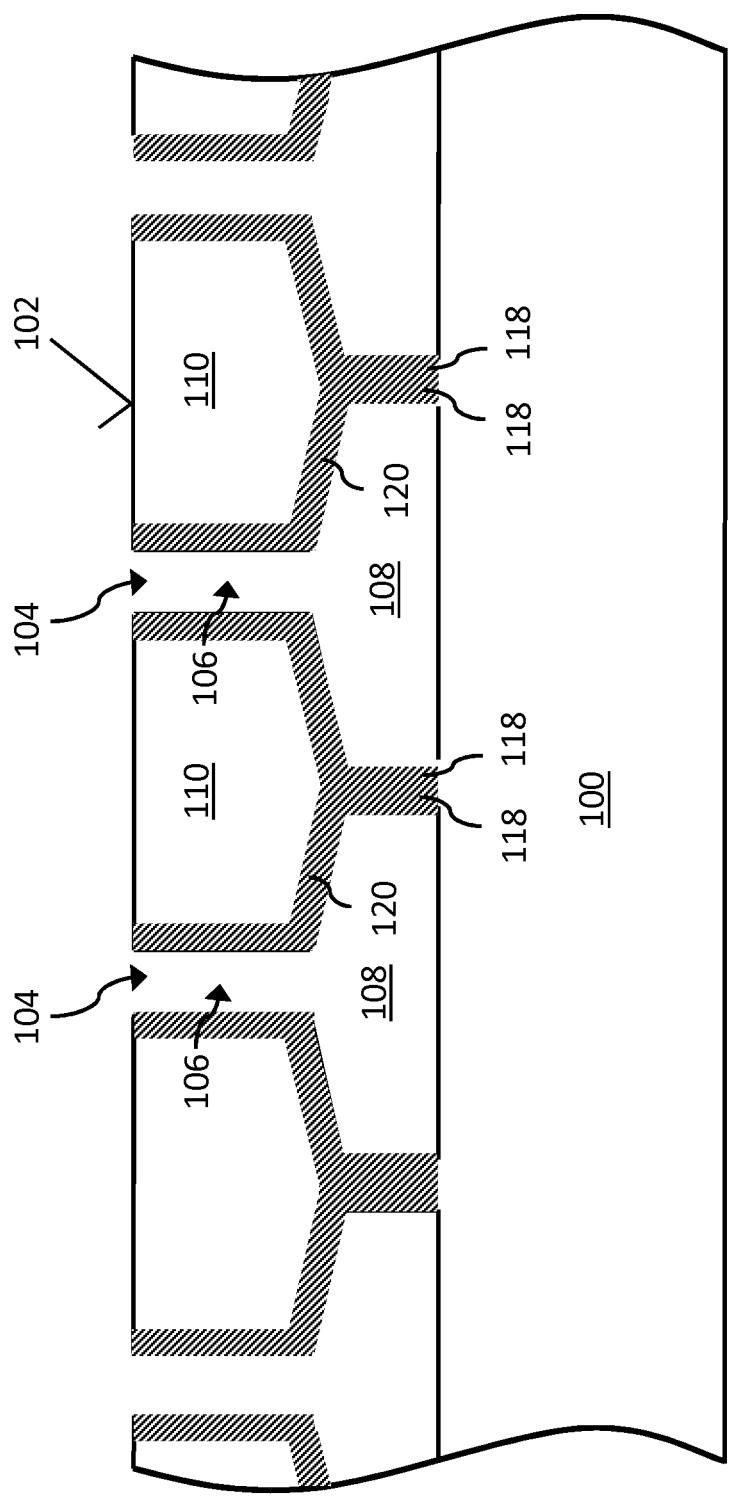
FIG. 2 including
Figure 2:
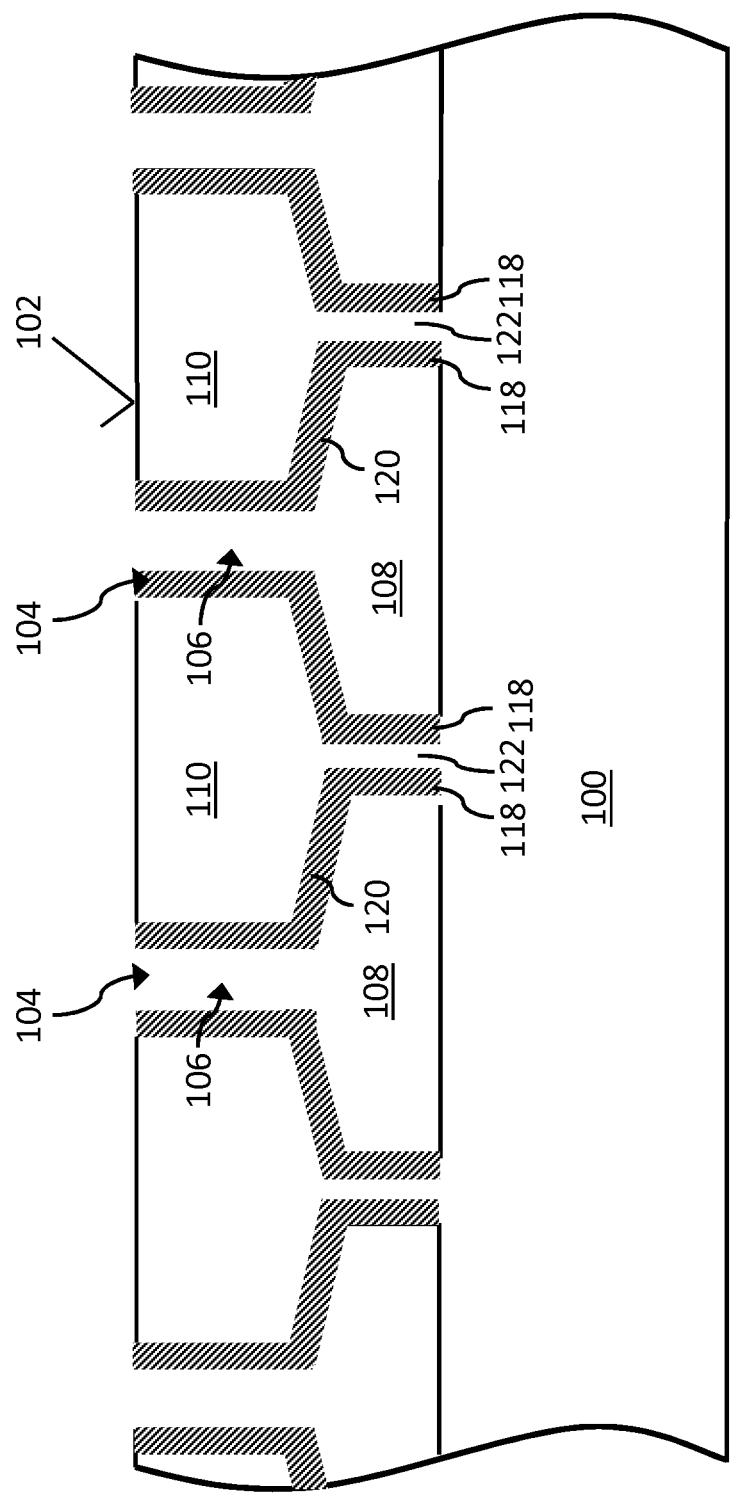

Referring to FIG. 2, dielectric support structures 118 are formed between the wider cavity parts 108 of the trenches 104. According to an embodiment, the dielectric support structures 118 are formed by an oxidation process whereby the narrower parts 106 of the trenches 104 are utilized as access trenches for the entry and exchange of process gasses. In this oxidation process, an oxidation agent, such as water vapor or oxygen, may be introduced into the wider cavity parts 108 of the trenches 104 through the narrower parts 106. The oxidation process may be a thermal oxidation process whereby the semiconductor material at internal sidewalls of the trenches 104 reacts with the oxidation agent at high temperature (e.g., 800° to 1200° C.). As a result, an oxide 120 expands into the semiconductor substrate 100, and in particular expands into the second region 112 of the semiconductor substrate 100 between adjacent trenches 104 to form the dielectric support structures 118. If needed, the surfaces 102 can be kept protected against the thermal oxidation process, by not removing the etching mask 114 utilized during the formation of the trench 104. In one embodiment, the composition of the masking material contains at least one oxygen barrier, for example a film of silicon nitride or silicon oxinitride, or silicon oxide.

In the embodiment of FIG. 2A, the oxidation is controlled such that the second region 112 between adjacent trenches 104 completely oxidizes. That is, the semiconductor material between the wider cavity parts 108 of adjacent trenches 104 is completely through-oxidized such that only the dielectric support structures 118 are interposed between the wider cavity parts 108 of adjacent trenches 104 after the second region 112 is completely oxidized. In FIG. 2A, the dielectric support structures 118 are highlighted by boundary lines for illustrative purposes only. The oxide 120 in the dielectric support structures 118 between adjacent trenches 104 may be indistinguishable from the oxide 120 that forms in other portions of the trenches 104.

FIG. 2B depicts an alternate embodiment in which the oxidation is controlled such that the second region 112 between adjacent trenches 104 only partly oxidizes. That is, the semiconductor material between the wider cavity parts 108 adjacent trenches 104 is not completely through-oxidized such that a buried via region 122 of semiconductor material remains between the wider cavity parts 108 of adjacent trenches 104 after the second region 112 is partly oxidized.

Controlling of the oxidation of the second region 112 of the semiconductor substrate 100 to produce the different embodiments of FIGS. 2A and 2B may be achieved by appropriately setting the process parameters. For example, the amount of oxidation agent, temperature and duration of the oxidation process, may be appropriately controlled so that the oxide 120 has a thickness corresponding to one half of a thickness of the second region 112. In addition the thickness of the second region 112 may be controlled. In one embodiment, the thickness ranges between 200 nm to 600 nm, e.g. with a target of 300 nm. The thickness of the second region 112 may be controlled by controlling the lateral spacing of adjacent trenches 104, which is determined by the masking and etching steps described above. In a process in which the thickness of the oxide 120 is well-known and tightly controlled, the thickness of the second regions 112 can be adjusted around this thickness. For example, by laterally spacing the trenches 104 apart from one another by different amounts such that a thickness of some of the second regions 112 is greater than twice a thickness of the oxide 120 and a thickness of other ones of the second regions 112 is less than twice a thickness of the oxide 120, some of the second regions 112 can be completely through-oxidized whereas other ones of the second regions 112 will only be partially oxidized.

Figure 3:
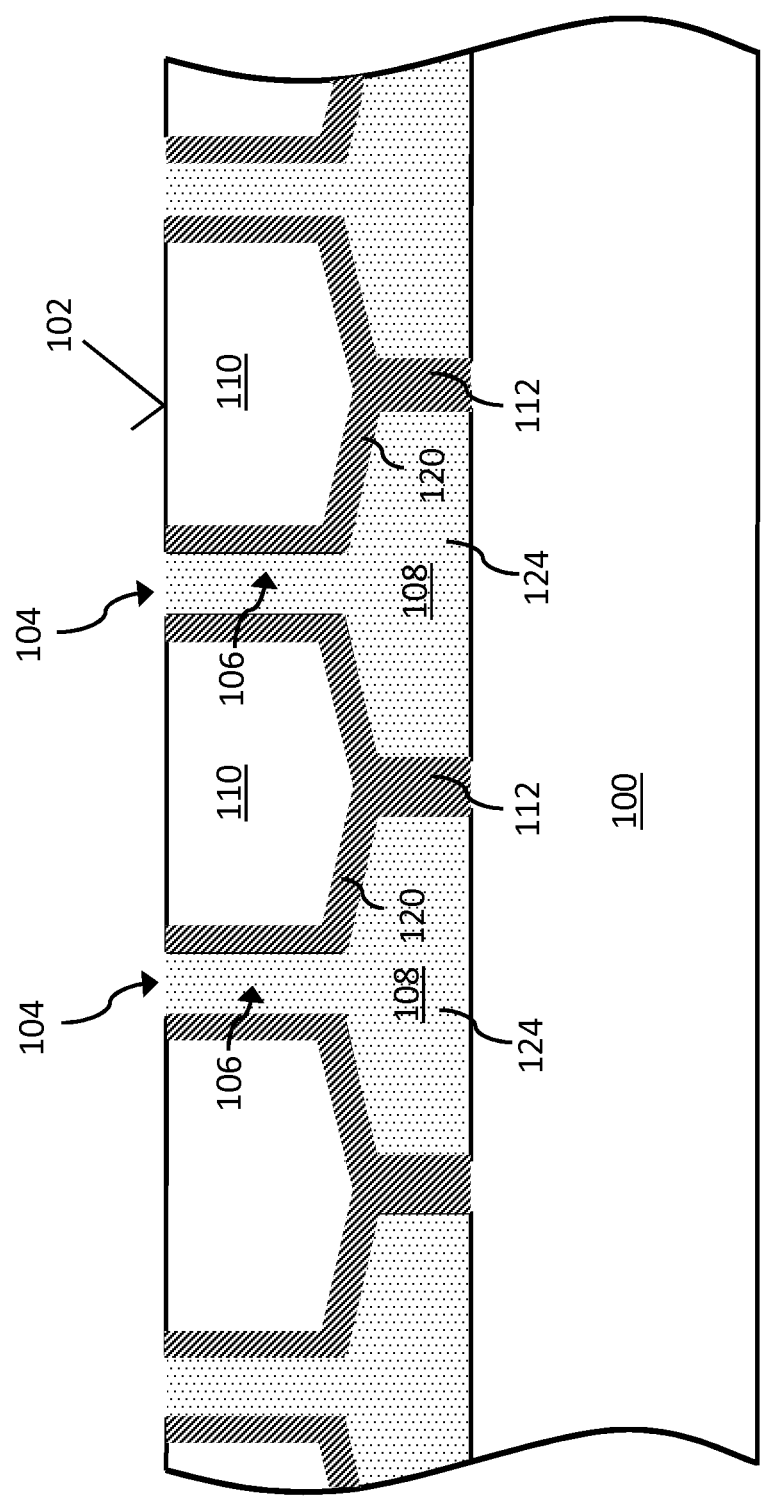
FIG. 3 depicts filling the trenches with a filler material, according to an embodiment.

Referring to FIG. 3, a filler material 124 that is used to remove a portion of the oxide 120 is provided in the trenches 104. The filler material 124 may be an etch-resistant material or any material that the oxide 120 may be etched selective to like, for example, amorphous or polycrystalline carbon, silicon nitride, CVD tungsten or a polymer, which may or may not be photosensitive.

Figure 4:
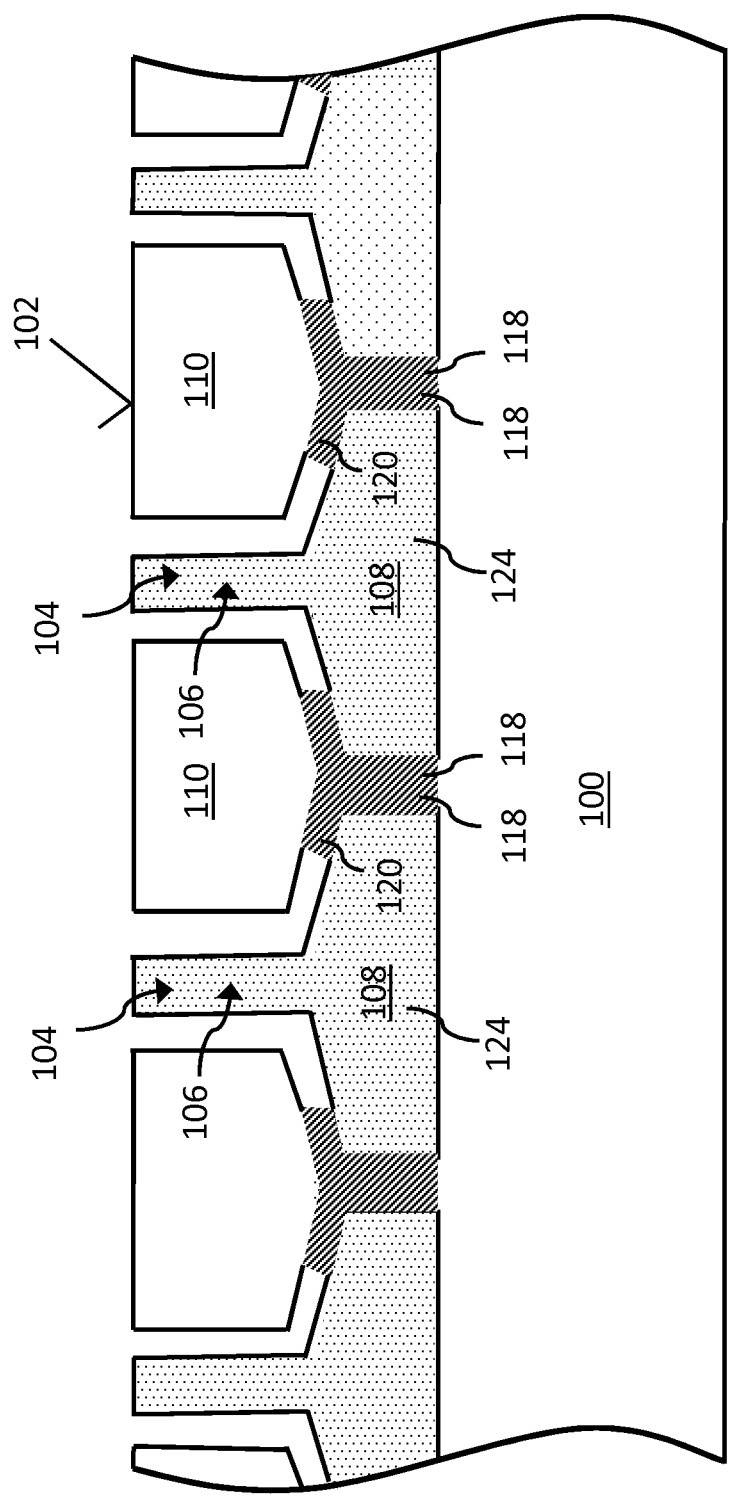
FIG. 4 depicts etching the oxide selective to the filler material in the narrower part of the trenches, according to an embodiment.
Figure 5:
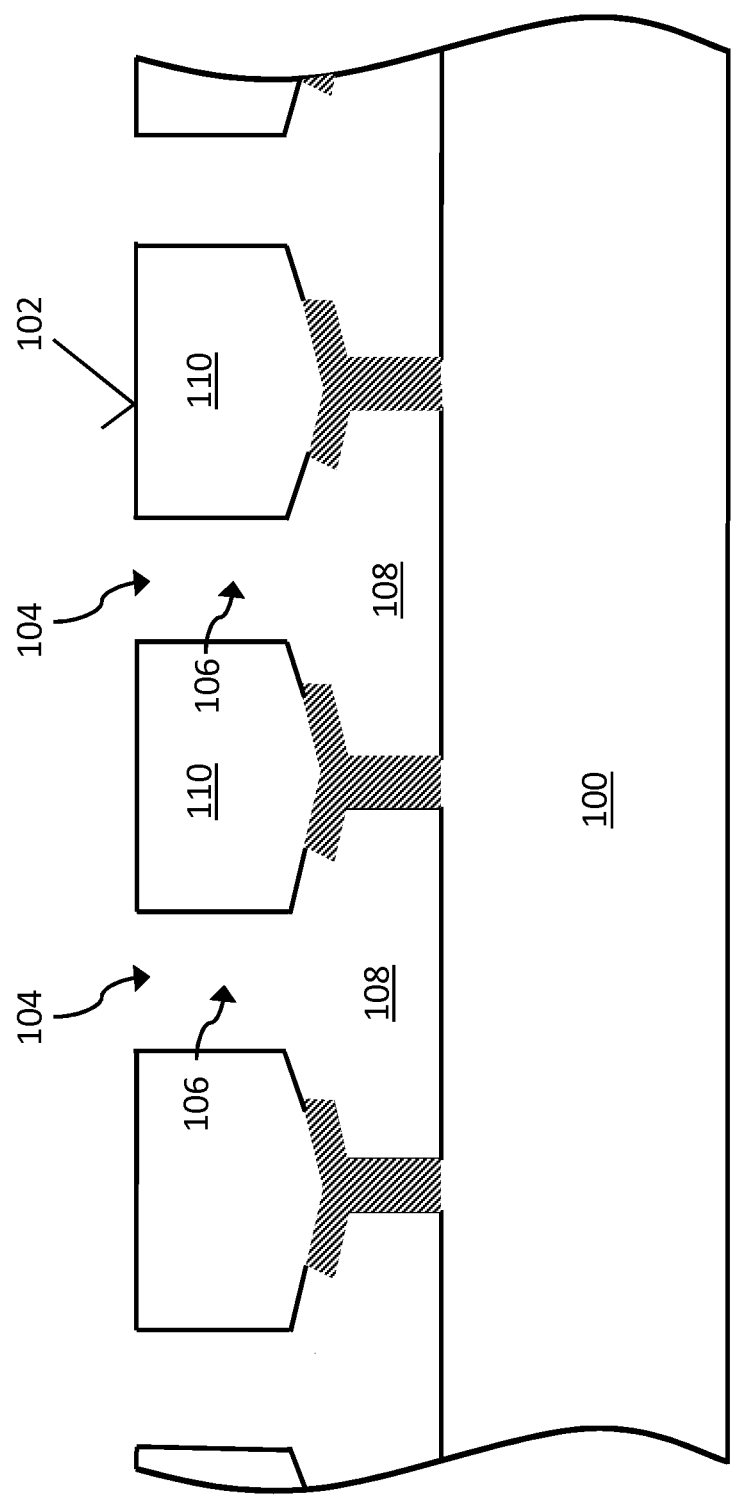
FIG. 5 depicts removing the filler material, according to an embodiment.

Referring to FIG. 4, the oxide 120 is removed from the narrower part 106 of the trenches by etching the oxide 120 selective to the filler material 124. This etching process is stopped before the etchant reaches the dielectric support structures 118 between the wider cavity parts 108 of adjacent trenches 104. In this manner, the filler material 124 is used to etch oxide 120 from the narrower parts 106 of the trenches 104 without removing the dielectric structures at the same time. Subsequently, as shown in FIG. 5, the filler material 124 may be removed from the trenches 104.

Figure 6:
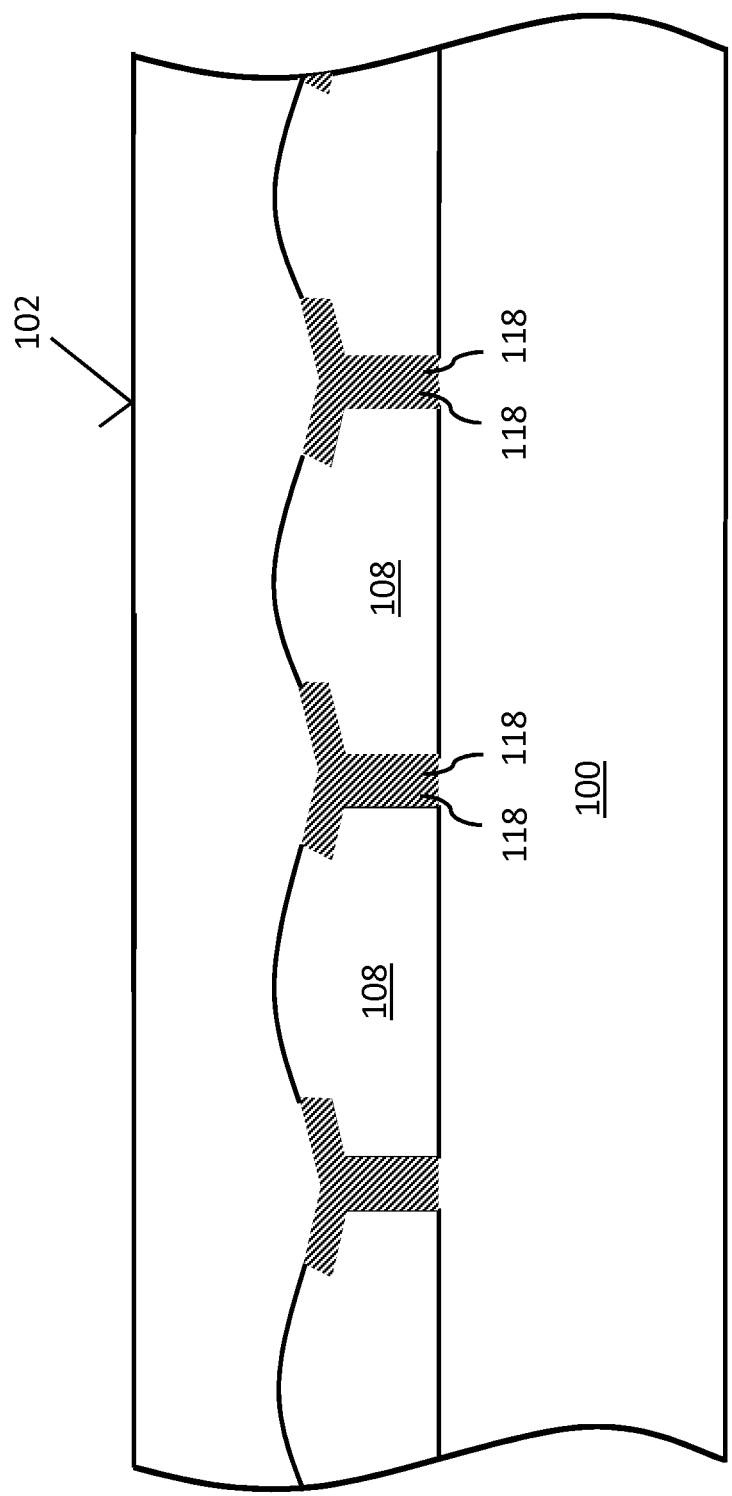
FIG. 6 depicts closing off the wider part of the trenches with a semiconducting material, according to an embodiment.

Referring to FIG. 6, the wider cavity part 108 of the trenches 104 is covered with a semiconducting material such that the trenches 104 are closed off. As a result, the wider cavity parts 108 are not accessible from the first surface 102 and instead are separated from the first surface 102 by a portion of semiconductor material.

According to an embodiment, closing off the trenches 104 with semiconducting material is achieved by shrinking the narrower part 106 of the trenches 104 where the oxide 120 has been removed. According to an embodiment, the narrower parts 106 are completely collapsed wherein the oxide 120 has been removed such that the interior sidewalls of the trench in the narrower parts 106 converge. This may be accomplished by performing the empty-space-in-silicon-technique described by Sato, et al., (2004), *Fabrication of Silicon-on-Nothing Structure by Substrate* 100 *Engineering Using the Empty-Space-in-Silicon Formation Technique, Japanese Journal of Applied Physics,* 43(1), 12-18, the content of which is incorporated by reference in its entirety. According to this technique, the semiconductor substrate 100 is placed in a Hydrogen ambient atmosphere and annealed for sufficient temperature and duration (e.g., 1110° C. for 10 Minutes) to cause the trenches 104 to rearrange such that lower portions of the trenches 104 expand and upper portions of the trenches 104 shrink until the semiconductor material converges. As described by Sato, et al., an array of pipe-shaped trenches may be used to form a large empty cavity within a semiconductor substrate by causing the lower portion of the pipe-shaped trenches to merge beneath the surface. By contrast, the present methods utilize bottle-neck shaped trenches with dielectric support structures 118 between the lower portions of the trenches 104 (i.e., the wider cavity parts 108) to prevent the lower portions from merging during annealing. Thus, the top portions of the trenches 104 (i.e., the narrower parts 106 may be shrunk and ultimately collapsed) while the lower portions of the trenches 104 (i.e., the wider cavity parts 108) remain as distinct electrically insulated entities within the substrate 100. By providing the dielectric support structures 118, SOI structures processed according to the present technique have a higher geometrical stability in comparison to conventional SON structures.

Figure 7:
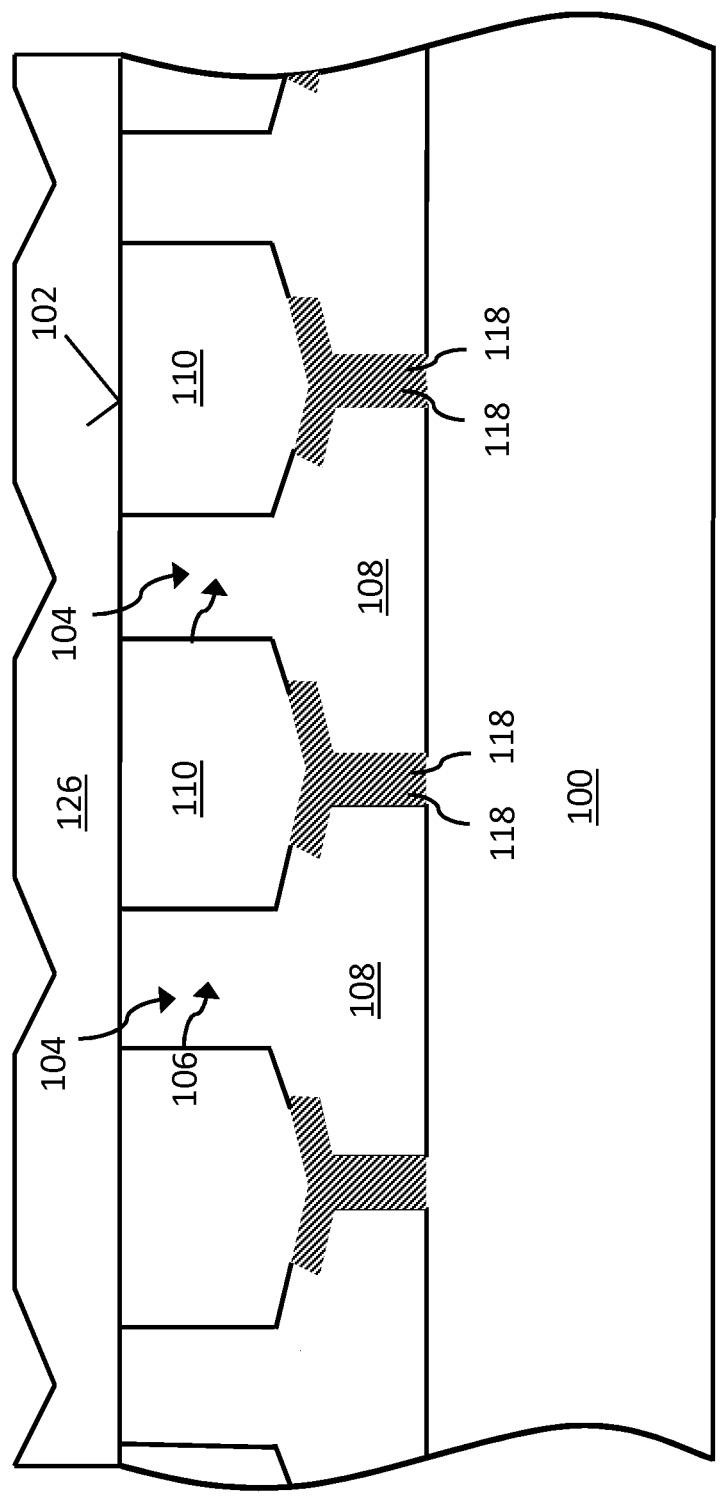
FIG. 7 depicts closing off the wider part of the trenches with a semiconducting material, according to another embodiment.

FIG. 7 depicts an alternate method that may be used to close off the trenches 104. According to the embodiment of FIG. 7, an epitaxial lateral overgrowth process is performed.

More particularly, an epitaxial layer 126 is grown at the first surface 102 between the trenches 104 such that the epitaxial layer 126 laterally expands as it grows in the vertical direction. The epitaxial lateral overgrowth process may consist of a number of epitaxial cycles, which may be referred to as growth cycles. During each growth cycle, thin crystalline layers are deposited on top of one another, using the immediately subjacent material as a template for the growth of a crystal structure. The sequence may be repeated until a continuous epitaxial layer 126 extends over the trenches 104 and encloses the wider cavity parts 108. In further process steps (not shown), this epitaxial layer 126 may be planarized and semiconductor devices may be formed on the epitaxial layer 126. Depending on the process parameters during the epitaxial growth, the epitaxial layer 126 may laterally extend and, hence, overgrow trench structures. To ensure that epitaxial layer is strictly mono-crystalline, in particular at the joining sections between two neighboring mesas (in a lateral projection of the wider cavity parts 108), mono-crystalline starting-substrates are provided by the first regions 110. Despite the first regions 110 being separated from each other by the narrow portions 104, their crystal structure has a wide-range order defined by the initial crystal structure of the substrate 100. Thus, the different epitaxial structures grown on the first sections 110 may be adjoined to one mono-crystalline layer.

The methods described with reference to FIGS. 1-7 may be used to form a silicon-on-insulator substrate for forming one or more semiconductor devices thereon. According to an embodiment, a plurality of trenches 104 as described above are formed in the substrate 100 and all of the trenches 104 in the plurality are covered (e.g., by hydrogen annealing or epitaxial lateral overgrowth). As a result, the substrate 100 includes a buried insulator layer beneath the first surface 102 consisting of the wider cavity parts 108 of the trenches 104 and the dielectric support structures 118. The buried insulator layer may formed as a continuous insulating layer if each of the second regions 112 are completely through-oxidized as described above with reference to FIG. 2A. According to an embodiment, the trenches 104 are formed across the entire substrate 100 such that this continuous insulating layer extends between opposite sides of the substrate 100.

The trenches 104 may be unfilled prior to the closing of the trenches such that the wider cavity parts 108 are filled with ambient atmosphere (i.e., air) when the trenches are closed off. Thus, the buried insulator layer is mostly formed from air. Because the dielectric constant of air is higher that of an oxide material, the silicon-on-insulator substrate described herein offers improved electrical isolation over SOI substrates utilizing $SiO_2$, for example, as the buried dielectric layer.

According to an embodiment, the buried insulator layer including the wider cavity parts 108 and the dielectric support structures 118 as described above is used as an etch stop layer for power devices (e.g., IGBTs, power MOSFETs, diodes) that are formed using epitaxial techniques. This buried insulator layer can be removed after thinning of an epitaxial layer. As a result, thickness variation of the device is only attributable to the thickness variation of the epitaxial layer and is not influenced by the thinning process. In these devices, other materials are possible for the buried insulation layers, such as nitride layers, oxynitride layers or various combinations.

Figure 8:
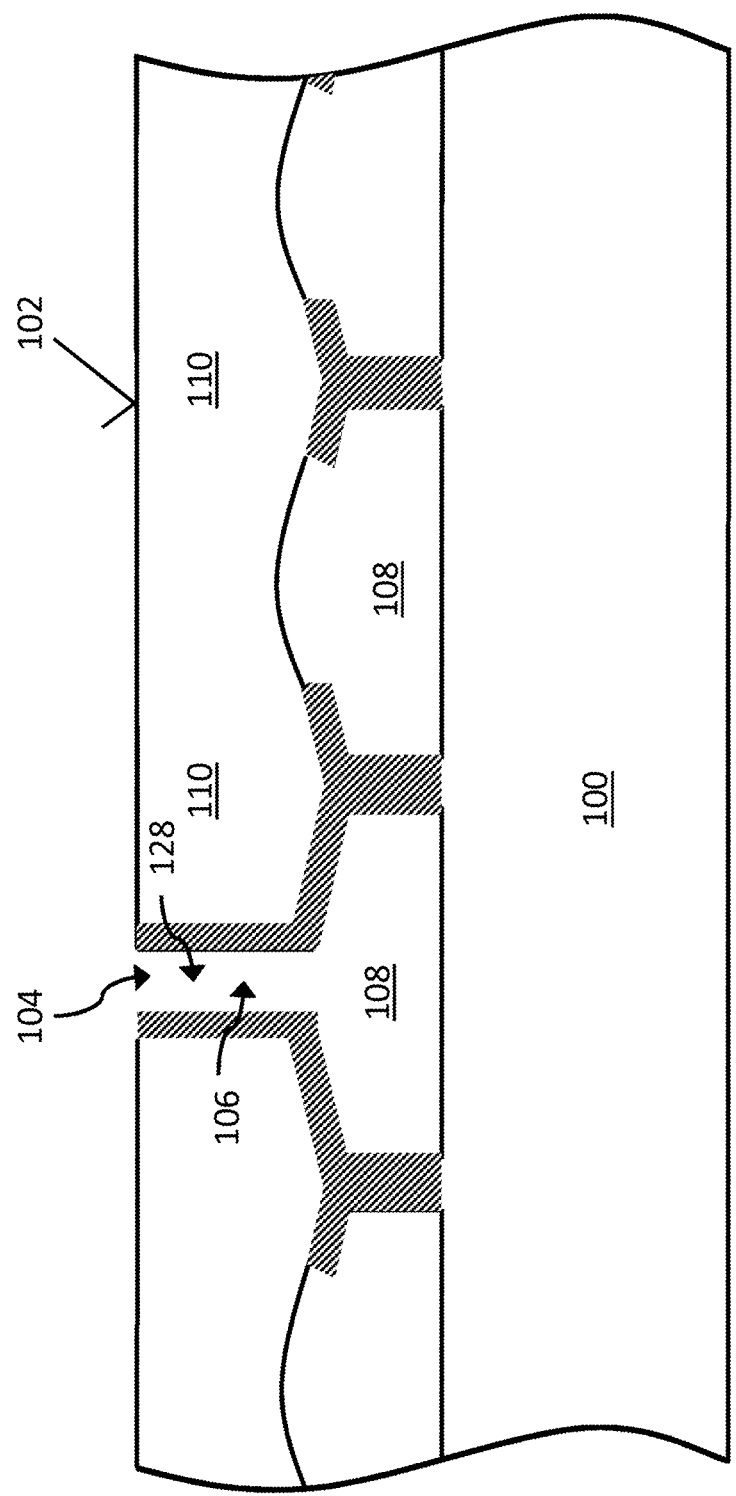
FIG. 8 depicts an embodiment in which the wider part of some of the trenches is closed off while the wider part of one of the trenches is prevented from being closed off.

FIG. 8 depicts an embodiment in which some but not all of the trenches 104 are closed. The device of FIG. 8 may be formed according to identical or similar process steps as described with reference to FIG. 1-7, except that measures are taken to prohibit one of the trenches 104 from being completely closed off while the other trenches 104 are covered (e.g., by hydrogen annealing or epitaxial lateral overgrowth). As a result, the narrower part 106 of at least one of the trenches 104 remains in open communication with the wider cavity part 108 after the closing process. That is, in the embodiment of FIG. 8, the process is controlled so that an access trench 128 between the first surface 102 and the wider cavity part 108 survives the closing process. In addition or in the alternative, the process may be controlled so that, within one of the trenches 104, one section is closed whereas another section remains unclosed.

Figure 9:
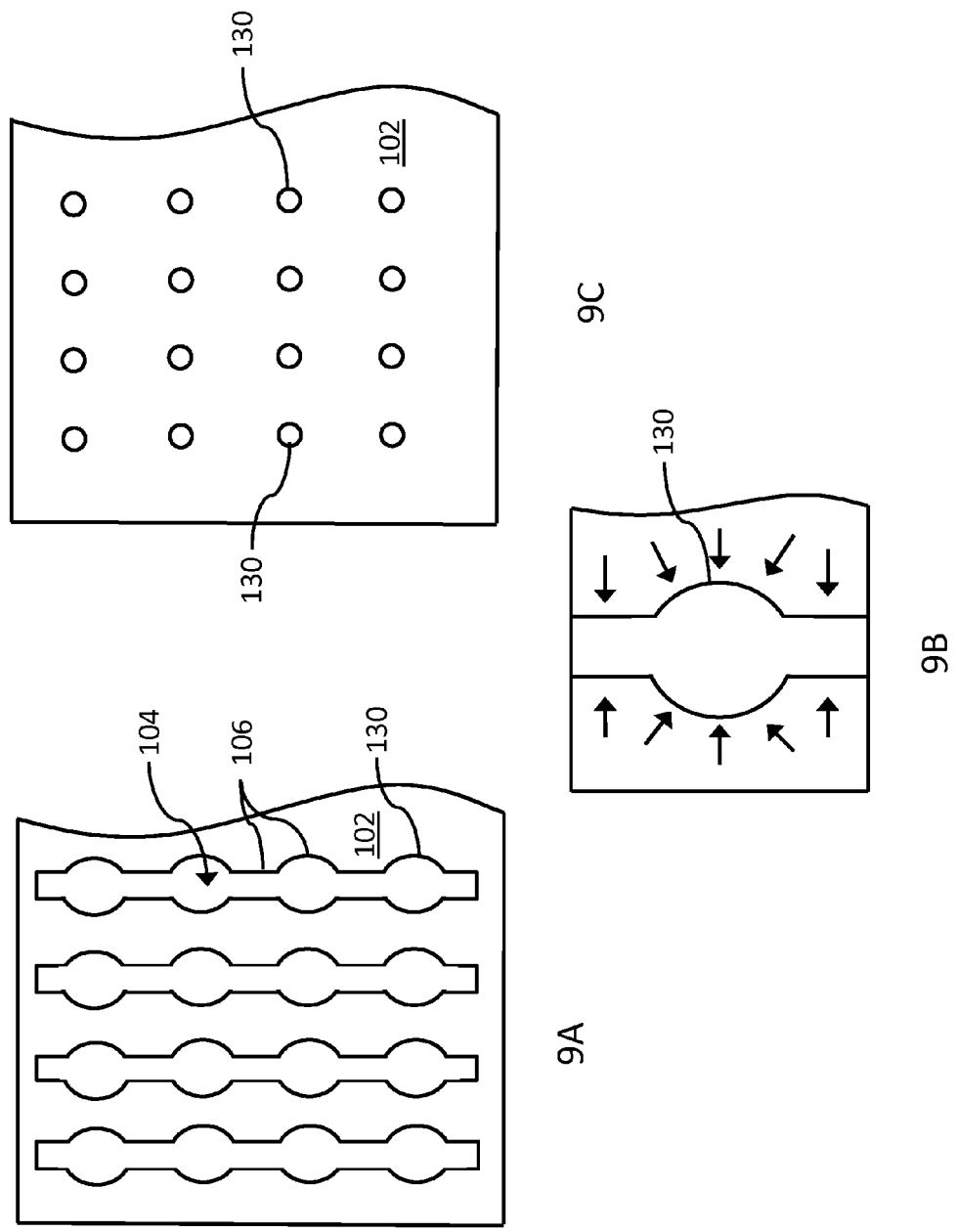
FIG. 9 including

Referring to FIG. 9, a method step that may be performed to prevent the narrower part 106 of one of the trenches 104 (or sections of a trench 104) from completely closing while other trenches 104 are closed is depicted. The method of claim 9 involves variation of the trench geometry such that some of the trenches 104 (or sections of a trench 104) completely close off before others during the closing process FIG. 9A depicts a plan-view of the substrate 100 showing the lateral topology of the narrower part 106 of the trenches 104 before the closing process. As can be seen, the trenches 104 are formed such that the narrower part 106 is widened in a surface via region 130. That is, dimensional variation is applied in a lateral direction of the substrate 100 to locally enlarge the narrower part 106 of the trenches 104. This locally enlarged region forms the surface via region 130.

FIG. 9B is an enlarged view of the trenches 104 at the surface via region 130. The arrows depict a direction of movement of the semiconductor material in the substrate 100 during the hydrogen annealing process described above. As can be seen, the annealing process causes the semiconductor material to migrate in a direction approximately orthogonal to the sidewalls of the trenches 104. Thus, the parallel sidewalls of the narrower part 106 (i.e., the portion of the narrower part 106 outside of the surface via region 130) will converge before the locally widened surface via region 130 converges.

FIG. 9C depicts a plan-view of the semiconductor substrate 100 after hydrogen annealing. As can be seen, the trenches 104 have been partially closed off but remain open at the surface via region 130. The geometry of the surface via region 130 (e.g., diameter, radius of curvature, etc.) may be varied to achieve any desired shape. Further, the same concept could be utilized to keep one of the trenches 104 completely open while other ones of the trenches 104 are completely closed during annealing. That is, the sidewalls of one entire trench 104 may be separated by a greater distance than in other trenches 104 such that the sidewalls of one entire trench 104 do not converge at all while the sidewalls of other trenches do converge. In addition, the same concept could be utilized in an epitaxial lateral overgrowth process to keep one of the trenches 104 (or a section of one of the trenches 104) from being completely covered by the epitaxially grown layer. The sidewall of epi-overgrowth may not be fully vertical and parallel to the sidewalls of the narrower part 106. For example, some other crystal facets may develop, along planes skewed with respect to the sidewalls of the narrower part 106.

Figure 10:
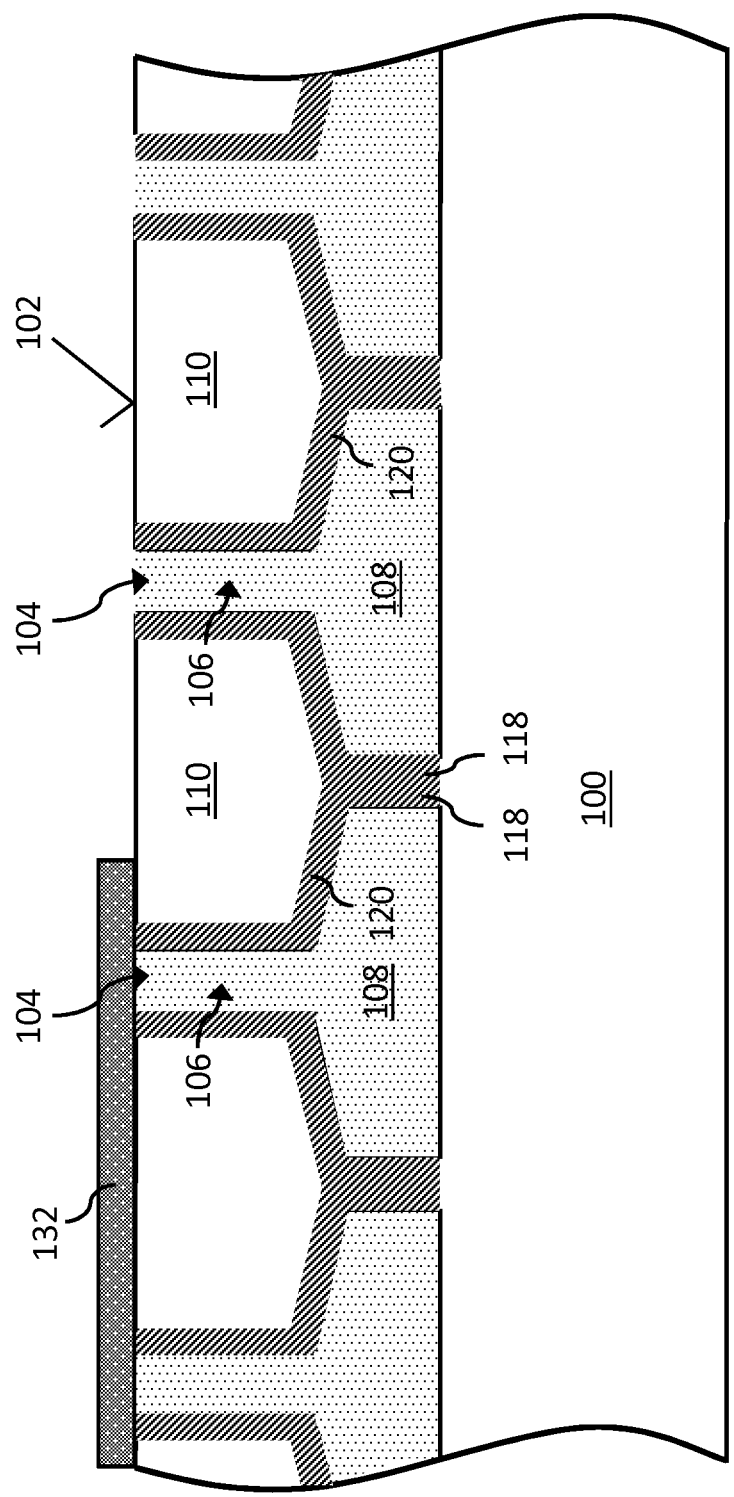
FIG. 10 depicts a method of preventing the narrower part of at least one of the trenches from completely closing by leaving oxide in the narrower part of the trenches, according to an embodiment.

Referring to FIG. 10, an method step that may be performed in addition or in alternative to the method step of FIG. 9 to prevent the narrower part 106 of one of the trenches 104 (or sections of a trench 104) from completely closing while other trenches 104 are closed is depicted. The method of claim 10 does not rely on trench geometry and instead utilizes the oxide 120 within the trenches 104 to prevent the oxidized sections from closing. The method of FIG. 10 is performed on the substrate 100 after the oxidation step of FIG. 2 and before the etching step of FIG. 3. According to this method, the narrower part 106 of one of the trenches 104 is covered with a material 132 that prevents the oxide 120 from being etched (e.g., an etch-resistant mask) during etching of the oxide 120 as discussed with reference to FIG. 3. As a result, the oxide 120 is removed from some, but not all, of the trenches 104 in the narrower part 106. The remaining oxide 120 prohibits the narrower part 106 from collapsing during hydrogen annealing.

The material 132 that prevents the oxide 120 from being etched may be formed along the first surface 102 in any of a variety of geometries. According to an embodiment, the material 132 is formed so that it completely covers one of the trenches 104 and leaves one of the trenches 104 completely uncovered. As a result, the trench 104 that is completely covered will remain oxidized across the entire length of the trench 104 in the narrower part 106 and thus will not collapse during hydrogen annealing. Alternatively, the material 132 may have a geometry such that it covers only a section of one (or more) of the trenches 104 but leaves other sections uncovered. As a result, one (or more) of the trenches 104 will collapse in a section and remain open in another section during hydrogen annealing.

Figure 11:
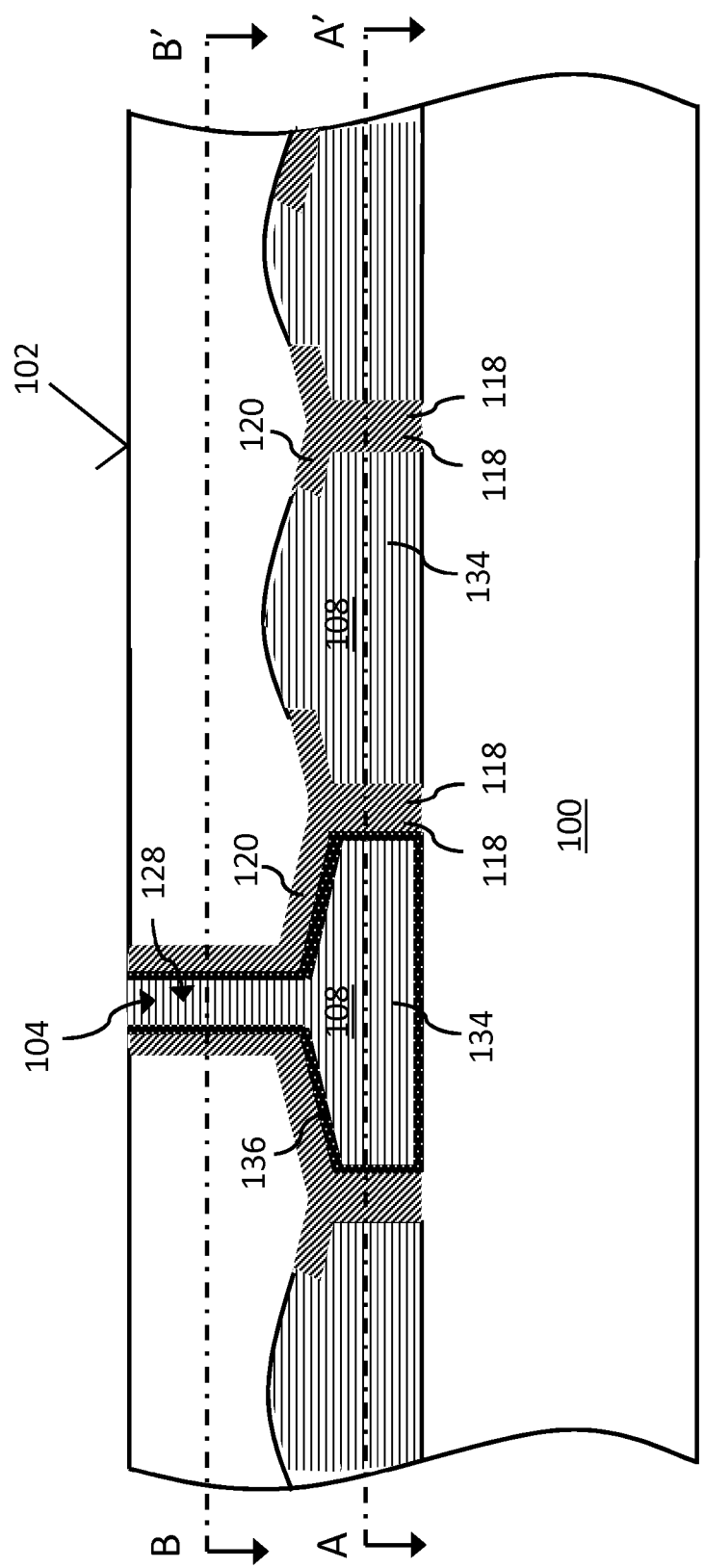
FIG. 11 depicts a substrate structure in which the trenches have been filled with a material, according to an embodiment.

FIG. 11 depicts an embodiment in which the trenches 104 have been filled with a material 134. According to an embodiment, all of the trenches 104 are filled with the material 134 prior to the closing of the trenches 104. FIG. 9 illustrates an embodiment which allows a trench filling after closing the trenches 104, e.g. by CVD (chemical vapor deposition), fluid flow, etc. Alternatively, later in the fabrication, other anisotropic etch processes, aligned with the buried cavity layout, can be used to access the buried wider cavity part 108, in order to fill them. In each case, the material 134 used to fill the trenches 104 may be any one a variety of materials, and may have a variety of different properties, depending application requirements.

According to an embodiment, the material 134 is an electrically insulating material, such as silicon dioxide (SiO$_2$). The material 134 may be deposited in the wider cavity parts 108 and in the access trenches 128. That is, the trenches 104 may be filled with an electrically insulating material 134 along all of the sidewalls of the trenches 104.

According to another embodiment, the material 134 is an electrically conductive material, such as copper, aluminum, or a region of (doped or undoped) polysilicon. According to yet another embodiment, the material 134 is a thermally conducting material 134 such as a phase change materials or other cooling media. In this embodiment, the trenches 104 may be used to provide heat transfer structures in high temperature applications that require cooling mechanisms.

Optionally, the trenches may be filled with a further layer 136 that lines the oxide 120. This further layer 136 may be formed in both the narrow part 106 and the wider cavity part 108. The further layer 136 may be a conductive material, such as copper, aluminum, or a region of (doped or undoped) polysilicon. According to an embodiment, the trenches 138 are filled with an electrically insulating material 134 and are lined by a further layer 136 of electrically conductive material. This may be done to form a charge-storing capacitor that is electrically connected to one or more devices that are formed at the first surface 102.

Two cross-sectional lines are shown in FIG. 11. Line A-A' extends through the wider cavity parts 108 and Line B'-B' extends through an access trench 128 (i.e., the narrower part 106 of the trench 104 that remains open while the other trenches 104 are closed). A wide variety of lateral geometries are possible in both regions. Thus, a wide variety of buried substrate structures including the material 134 (or materials) and oxide 120 are possible. Some examples of such structures and the corresponding methods of formation will now be described.

Figure 12:
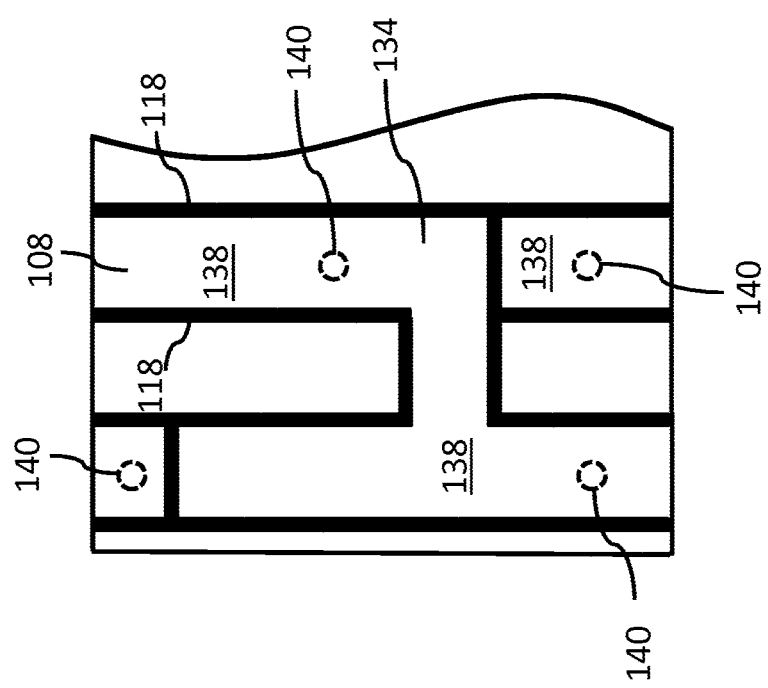
FIG. 12 depicts a possible layout of the substrate along the cross-sectional line A-A- of FIG. 11 in which the wider cavity parts are configured as a buried bus lines, according to an embodiment.

FIG. 12 depicts an exemplary embodiment of a layout of the wider cavity parts 108 along the cross-sectional line A-A' shown in FIG. 11. In this embodiment, the material 134 is an electrically conductive material and forms a buried bus line 138 within the semiconductor substrate 100. The buried bus line 138 may be electrically connected to one or more semiconductor devices (e.g., MOSFET logic devices.) that are formed at the first surface 102 of the substrate 100. The dielectric support structures 118 provide electrical insulation between adjacent bus lines 138. Furthermore, the wider cavity parts 108 may be formed to conduct electrical signals/potentials or have a relatively large cross-sectional area so that the buried bus lines 138 can accommodate large electrical currents.

The electrical connection between the buried bus lines 138 and the active devices may be effectuated using the access trench 128. According to an embodiment, the access trench 128 is formed as a circular surface via region 130 as discussed with reference to FIG. 9. The access trench 128 is filled with an electrical conductor (e.g., polysilicon) and forms vertical via connections 140 between the buried bus line 138 and the first surface 102. The vertical via connections 140 depicted in FIG. 12 represent the geometry of the access trench 128 along the cross-sectional line B-B'.

Advantageously, the buried bus line 138 can be used to replace one or more top-level metallization layers (i.e., back end of the line metallization) in an integrated circuit. According to one embodiment, the buried bus lines 138 are configured as a voltage supply line (i.e., VCC+/− or GND) that is electrically connected to one or more semiconductor devices formed on the substrate 100 by the vertical via connections 140. According to an alternate embodiment, the buried bus lines 138 are configured as independent signal lines that electrically connect two or more semiconductor devices formed on the substrate 100 together. In either case, the complexity of the top-level metallization is reduced because one of the top-level layers (e.g., voltage supply or M1 metallization) is not necessary. As a result, device fabrication is less expensive and less complex in comparison to conventional SOI technology.

The dielectric support structures 118 between the wider cavity parts 108 define the boundaries of the buried bus lines 138. The buried bus lines 138 may have any one of a variety of geometries that are possible by the above described trench formation and oxidation processes. For example, the trenches 104 and the dielectric support structures 118 may be formed in parallel longitudinal lines (i.e., stripes) along the semiconductor substrate 100 so that each of the buried bus lines 138 are linear and run parallel to one another. Alternatively, the trenches 104 may be formed so that the buried bus lines 138 intersect beneath the first surface 102 (e.g., in a T-shaped or X-shaped junction). In addition or in the alternative, two buried bus lines 138 that do not converge beneath the first surface 102 may be electrically connected at the first surface 102. This connection may be completed by using the vertical via connections 140, upper level metallizations above the first surface 102, and/or logic devices and the corresponding interconnect layers at the first surface 102.

Figure 13:
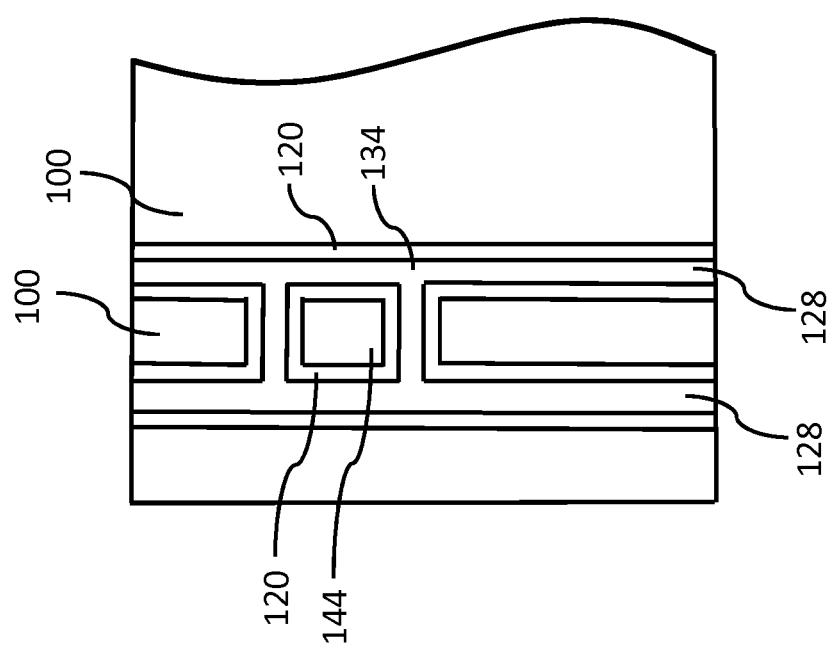
FIG. 13 depicts a possible layout of the substrate along the cross-sectional line B-B- of FIG. 11 in which an access trench encloses a portion of the semiconductor material, according to an embodiment.

FIG. 13 depicts an exemplary layout of the access trenches 128 along the cross-sectional line B-B' of FIG. 11.

In this embodiment, the access trenches 128 have spaced apart sidewalls extending in the lateral direction. That is, these access trenches 128 are not configured as the circular surface via region 130 as described above and have sidewalls that laterally extend parallel to one another across the substrate 100. This configuration can be achieved by forming the trenches 104 with parallel sidewalls and covering the trenches 104 prior to etching of the oxide 120 so as to prevent the trenches 104 from closing in the manner discussed with reference to FIG. 10. According to an embodiment, the access trench 128 encloses a portion 144 of the semiconductor substrate 100. For example, the access trench 128 may be formed as a polygon (e.g., square, rectangle, triangle, etc.) or a circle. According to an embodiment, the trenches 104 that include the access trench 134 are filled with an electrically conductive or electrically insulating material 134 so as to electrically isolate the enclosed portion 144 from adjacent regions of the semiconductor substrate 100.

Figure 14:
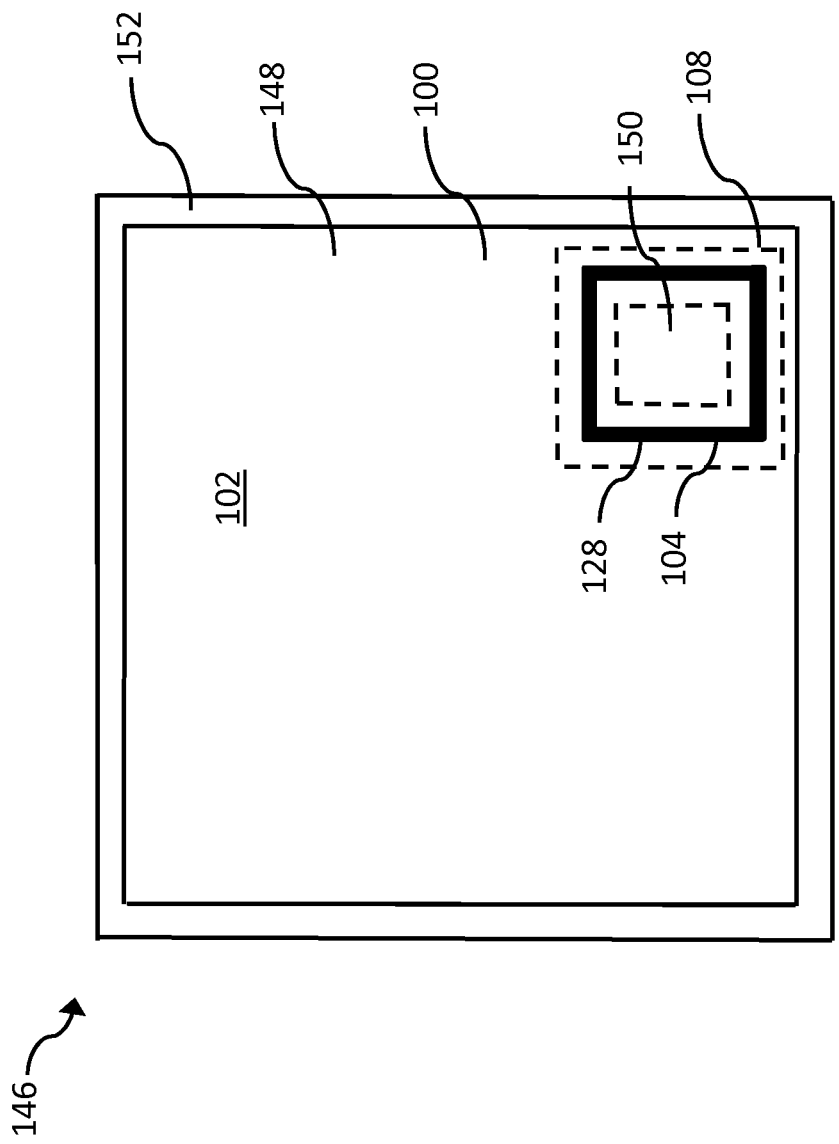
FIG. 14 depicts a plan-view of a semiconductor chip having a logic region isolated from a power transistor region, according to an embodiment.

FIG. 14 illustrates a chip level plan-view of a semiconductor device 146 that may be formed according to the methods described herein. The semiconductor device 146 of FIG. 14 is an integrated side-by-side structure including a power transistor portion 148 and a logic portion 150. The power transistor portion 148 may include IGBTs, for example. These IGBTs may be lateral devices configured to conduct a load current in a direction parallel to the first surface 102 or alternatively, may be vertical devices configured to conduct a load current in a direction perpendicular to the first surface 102. The logic portion 150 may include vertical or lateral CMOS logic devices, for example. The semiconductor substrate 100 includes a plurality of wider cavity parts 108 (not shown) beneath the surface 102 of the substrate 100. These wider cavity parts 108 form dielectrically insulated buried cavities in the device 146. An edge termination region 152 may be provided between the edge of the device 146 and both portions 148, 150.

In the embodiment, of FIG. 14, the logic portion 150 is insulated from the power transistor portion 148 by one of the trenches 104. This trench 104 includes an access trench 128 that forms a closed loop at the first surface 102 around the logic portion 150. The access trench 128 extends from the first surface 102 the wider cavity part 106 of one of the trenches 104 that forms a perimeter cavity having a correspondingly shaped closed loop beneath the first surface 102. That is, the access trench 128 and the perimeter cavity are a single trench 104 that surrounds a portion of the substrate 100. Additional trenches 104 and the dielectric support structures 118 may be used to form a continuous insulation layer inside of the perimeter cavity beneath the first surface 102. Thus, a three-dimensional region of the semiconductor material inside the access trench 128 that forms the logic portion 150 may be completely electrically insulated from the power transistor portion 148. Alternatively, the dielectric support structures 118 beneath the logic portion 150 may be spaced apart from one another so that an electrical connection can be effectuated in a buried via region (e.g., in the manner described with reference to FIG. 2B). According to an embodiment, one of the devices in the logic portion 150 is connected to a substrate potential by a buried via that extends between the dielectric support structures 118.

The access trench 128 and the wider cavity parts 108 may be formed by an etching step that also forms gate and field electrode trenches for the power transistor portion 148. Further, the dielectric support structures 118 between adjacent ones of the wider cavity parts 108 may be formed during the same oxidation process that forms a gate/field oxide in the gate and field electrode trenches for the power transistor portion 148. In this manner, the formation of the buried cavities and access trenches 128 in the logic portion 150 does not require additional steps that could potentially add expense and complexity to the process.

According to an embodiment, the access trench 128 and the perimeter cavity are filled with an electrically conductive material and tied to a potential that is present in the power transistor portion 148. This potential may be, for example, a source or gate potential of the power transistors in the power transistor portion 148. Alternatively, this potential may be a floating potential. Further, the potential may be fed inside the logic portion 150 (i.e. inside of the access trench 128) using the buried via and/or the surface vertical via connections 140 as previously discussed.

According to an embodiment, a logic portion 150 is adjacent to a power device portion and the electrical connections between the two regions are provided by the buried bus lines 138 as described herein. Several different potentials may be fed from the power transistor portion 148 to the logic portion 150 and vice-versa using the buried bus lines 138 and the buried via and/or the surface vertical via connections 140. For example, source potentials, gate potentials, and/or a further potential may be fed from devices in the power transistor portion 148 using the buried bus lines 138 and vertical via connections. In this way, the devices in the logic portions 150 may use the source and gate potential of the devices in the power transistor portion 148 as Vcc−/+, respectively, and thus are responsive to the switching of the devices in the power device portions. A further/third potential may be connected inputs of the devices in the logic portion 150 using the buried via and/or the surface vertical via connections 140.

According to an embodiment, one of the devices in the logic portion 150 is used to short the gate and source potentials supplied to the devices in the power transistor portion 148. These source and gate potentials may be carried on buried bus line 138 that extends from the power transistor portion 148 to the logic portion 150 beneath the surface 102 of the substrate 100. The devices in the logic portion 150 may be connected to these gate and source potentials using the using the buried via and/or the surface vertical via connections 140. The shorting of the source and gate potentials may be triggered by a temperature sensor in the logic portion 150 or by third signal carried on a buried bus line 138 from the power transistor portion from the power transistor portion 148 to the logic portion 150, for example.

Spatially relative terms such as "under," "below," "lower," "over," "upper," "above," "beneath" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method of forming a semiconductor device, the method comprising:
  forming a plurality of trenches extending into a semiconductor substrate from a first surface of the semiconductor substrate, each of the trenches comprising a narrower part in open communication with a wider part that is spaced apart from the first surface by the narrower part, the narrower part of adjacent trenches being laterally separated by a first region of the semiconductor substrate, the wider part of adjacent trenches being laterally separated by a second region of the semiconductor substrate that is narrower than the first region, the first and the second regions of the semiconductor substrate comprising the same semiconductor material; and
  introducing an oxidizing agent into the wider part of the trenches through the narrower part of the trenches to oxidize sidewalls of the trenches in the narrower part that face the first region and to oxidize sidewalls of the trenches in the wider part that face the second region, the oxidized sidewalls in the wider part forming dielectric support structures that support the first region of the semiconductor substrate;
  removing the oxide from the sidewalls of the trenches in the narrower part; and
  closing off the trenches with semiconductor material after removing the oxide.

2. The method of claim 1, wherein the oxidation of the sidewalls of the trenches in the wider part is controlled such that the second region is completely oxidized between adjacent trenches and only the dielectric support structures are interposed between the wider parts of adjacent trenches after the second region is completely oxidized.

3. The method of claim 1 wherein the oxidation of the sidewalls of the trenches in the wider part is controlled such that the second region is partly oxidized between a plurality of adjacent trenches and a semiconductor region remains between the wider parts of the plurality of adjacent trenches after the second region is partly oxidized.

4. The method of claim 1, wherein closing off the trenches comprises at least one of: shrinking the narrower part of at least one of the trenches, and growing a semiconductor layer over the narrow part of at least one of the trenches.

5. The method of claim 4,
  wherein removing the oxide from the sidewalls of the trenches in the narrower part comprises:
    filling the trenches with a filler material;
    etching the oxide from the sidewalls of the narrower part of at least some of the trenches selective to the filler material; and
    stopping the etching of the oxide before the etching reaches the dielectric support structures between the wider part of adjacent trenches.

6. The method of claim 5, wherein closing off the trenches with semiconductor material comprises shrinking the narrower part of at least some of the trenches comprises by annealing the semiconductor substrate in a hydrogen atmosphere.

7. The method of claim 6, further comprising preventing the narrow part of at least one of the trenches from completely converging by widening the narrow part of at least one trench in a via region such that that the narrower part remains in open communication with the wider part in the via region after annealing.

8. The method of claim 6, further comprising:
  preventing the narrower part of at least one of the trenches from completely closing during annealing; and
  completely closing the narrower part of other trenches in the plurality during annealing,
  wherein preventing the narrower part of at least one of the trenches from completely closing comprises covering the narrower part of the at least one trench with a material prior to closing off the trenches, the material being configured to prevent the oxide in the at least one trench from being etched during etching of the oxide in the other trenches in the plurality.

9. The method of claim 1, wherein closing off the trenches with semiconductor material comprises an epitaxial lateral overgrowth process in which semiconductor material is grown over the narrower part of at least some of the trenches.

10. The method of claim 1, further comprising:
  filling at least some of the trenches with an electrically conductive material to form a buried bus line;
  forming one or more semiconductor devices at the first surface of the substrate; and
  electrically connecting the one or more semiconductor devices to the buried bus line.

11. The method of claim 1, further comprising:
  enclosing a device region of the semiconductor substrate by one or more of the trenches;
  filling the one or more trenches that enclose the device region with an electrically conductive material or an electrically insulating material so as to electrically isolate the device region from adjacent regions of the semiconductor substrate; and
  forming one or more semiconductor devices in the device region.

12. The method of claim 1, further comprising:
  lining sidewalls of the wider part of at least some of the trenches with an electrically conductive material.

13. A method of forming a silicon-on-insulator substrate for forming one or more semiconductor devices thereon, the method comprising:
  forming a plurality of trenches extending from a first surface of a semiconductor substrate, each of the trenches comprising a narrower part extending from the first surface to a wider cavity part that is spaced apart from the first surface, the semiconductor substrate comprising a single semiconductor material;
  oxidizing interior sidewalls of the trenches in the narrower part and the wider part to form dielectric support structures, the dielectric support structures arranged between the cavity parts of adjacent trenches and spaced apart from the first surface;
  removing the oxide from the sidewalls of the trenches in the narrower part;
  closing the narrower part of each of the trenches with semiconductor material in the plurality to form a buried insulator layer beneath the first surface, the buried insulator layer comprising the wider cavity parts of the trenches and the dielectric support structures.

14. The method of claim 13, wherein the cavity parts are unfilled prior to closing the narrower part of each of the trenches, and wherein the buried insulator layer forms a continuous insulating layer extending between opposite sides of the substrate.

15. The method of claim 1, wherein the wider parts of the trenches are unfilled prior to closing off the trenches with semiconductor material.

* * * * *